(12) United States Patent
Clevenger et al.

(10) Patent No.: US 9,324,793 B2
(45) Date of Patent: Apr. 26, 2016

(54) METHOD FOR CONTROLLING THE PROFILE OF AN ETCHED METALLIC LAYER

(71) Applicants: International Business Machines Corporation, Armonk, NY (US); STMicroelectronics, Inc., Coppell, TX (US)

(72) Inventors: Lawrence A. Clevenger, LaGrangeville, NY (US); Carl J. Radens, LaGrangeville, NY (US); Richard S. Wise, Newburgh, NY (US); Edem Wornyo, Danbury, CT (US); Yiheng Xu, Hopewell Junction, NY (US); John Zhang, Fishkill, NY (US)

(73) Assignees: International Business Machines Corporation, Armonk, NY (US); STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 14/871,157

(22) Filed: Sep. 30, 2015

(65) Prior Publication Data

US 2016/0020105 A1 Jan. 21, 2016

Related U.S. Application Data

(62) Division of application No. 14/187,598, filed on Feb. 24, 2014.

(51) Int. Cl.
*H01L 21/461* (2006.01)
*H01L 23/58* (2006.01)
*H01L 29/06* (2006.01)
*H01L 29/66* (2006.01)
*H01L 51/05* (2006.01)

(52) U.S. Cl.
CPC ...... *H01L 29/0661* (2013.01); *H01L 29/66621* (2013.01); *H01L 51/0525* (2013.01)

(58) Field of Classification Search
CPC ............... H01L 29/0661; H01L 29/66621
USPC .............. 438/725, 733, 780; 257/642, 644
See application file for complete search history.

(56) References Cited

U.S. PATENT DOCUMENTS

| 5,976,986 | A | 11/1999 | Naeem et al. |
|---|---|---|---|
| 6,242,165 | B1 | 6/2001 | Vaartstra |
| 7,247,575 | B2 | 7/2007 | Cheng et al. |
| 7,833,075 | B2 | 11/2010 | Oh et al. |
| 8,283,255 | B2 | 10/2012 | Cho et al. |
| 2015/0243510 | A1* | 8/2015 | Clevenger ........... H01L 21/3086 438/584 |

FOREIGN PATENT DOCUMENTS

| EP | 0 229 248 A1 | 1/1989 |
|---|---|---|
| JP | 2000-138202 A | 5/2000 |
| KR | 10-2008-0015169 | 2/2008 |

* cited by examiner

*Primary Examiner* — Calvin Lee
(74) *Attorney, Agent, or Firm* — Scully, Scott, Murphy & Presser, P.C.; Steven J. Meyers

(57) ABSTRACT

An ashing chemistry employing a combination of $Cl_2$ and $N_2$ is provided, which removes residual material from sidewalls of a patterned metallic hard mask layer without residue such that the sidewalls of the patterned metallic hard mask layer are vertical. The vertical profiled of the sidewalls of the patterned metallic hard mask layer can be advantageously employed to reduce pattern factor dependency in the etch bias between the pattern transferred into an underlying layer and the pattern as formed on the metallic hard mask layer. Further, the ashing chemistry can be employed to enhance removal of stringers in vertical portions of a metallic material layer.

17 Claims, 13 Drawing Sheets

METHOD FOR CONTROLLING THE PROFILE OF AN ETCHED METALLIC LAYER

The present application is a divisional application of U.S. patent application Ser. No. 14/1.87,598, filed Feb. 24, 2014 entitled "METHOD FOR CONTROLLING THE PROFILE OF AN ETCHED METALLIC LAYER", the entire contents of which are incorporated herein by reference.

BACKGROUND

The present disclosure relates to semiconductor processing methods, and particularly to a method of ashing a patterned organic material and structures for implementing the same.

A tapered profile in a patterned hard mask layer can induce pattern-factor-dependent etch bias variations in the width of the patterns that are transferred into an underlying material layer. Typical ashing processes employing oxygen are prone to formation of such a tapered profile in a patterned hard mask layer. Further, formation of a taper in a vertical material portion can impede recessing of the vertical material portion due to residual material trapped in divots. Thus, an ashing chemistry that does not provide a tapered profile in a patterned hard mask layer is desired.

SUMMARY

An ashing chemistry employing a combination of $Cl_2$ and $N_2$ is provided, which removes residual material from sidewalls of a patterned metallic hard mask layer without residue such that the sidewalls of the patterned metallic hard mask layer are vertical. The vertical profile of the sidewalls of the patterned metallic hard mask layer can be advantageously employed to reduce pattern factor dependency in the etch bias between the pattern transferred into an underlying layer and the pattern as formed on the metallic hard mask layer. Further, the ashing chemistry can be employed to enhance removal of stringers in vertical portions of a metallic material layer.

According to an aspect of the present disclosure, a method of forming a structure is provided. A vertical stack is provided, which includes, from bottom to top, at least a material layer, a dielectric hard mask layer, a metallic hard mask layer, an organic planarization layer (OPL), and a photoresist layer. The photoresist layer is lithographically patterned. A pattern in the photoresist layer is transferred through the OPL and the metallic hard mask layer in a first anisotropic etch. The pattern is transferred through the dielectric hard mask layer in a second anisotropic etch while forming an organo-metallic passivation spacer on sidewalls of an opening in the metallic hard mask layer. The organo-metallic passivation spacer includes a compound of at least an elemental metal in the metallic hard mask layer and halogen. A residual portion of the OPL and the organo-metallic passivation spacer are simultaneously removed employing an ashing process. The ashing process employs a combination of $Cl_2$ and $N_2$ to remove the OPL and the organo-metallic passivation spacer.

According to another aspect of the present disclosure, another method of forming a structure is provided. A vertical stack is formed on a planar top surface and a recessed horizontal surface that re provided on, or over, a substrate. The vertical stack includes, from bottom to top, at least a gate dielectric layer, a metallic material layer, an organic planarization layer (OPL), and a photoresist layer. The photoresist layer is lithographically patterned. The OPL and the metallic material layer are etched employing at least one anisotropic etch that employs the patterned photoresist layer as an etch mask. Physically exposed portions of the gate dielectric layer are etched. A residual portion of the OPL and a vertical portion of the metallic material layer over the recessed horizontal surface are removed employing an ashing process. The ashing process employs a combination of $Cl_2$ and $N_2$ to remove the OPL and the vertical portion of the metallic material layer.

DETAILED DESCRIPTION

As stated above, the present disclosure relates to a method of ashing a patterned organic material and structures for implementing the same. Aspects of the present disclosure are now described in detail with accompanying figures. The drawings are not necessarily drawn to scale. As used herein, ordinals such as "first" and "second" are employed merely to distinguish similar elements, and different ordinals may be employed to designate a same element in the specification and/or claims.

Figure 1:
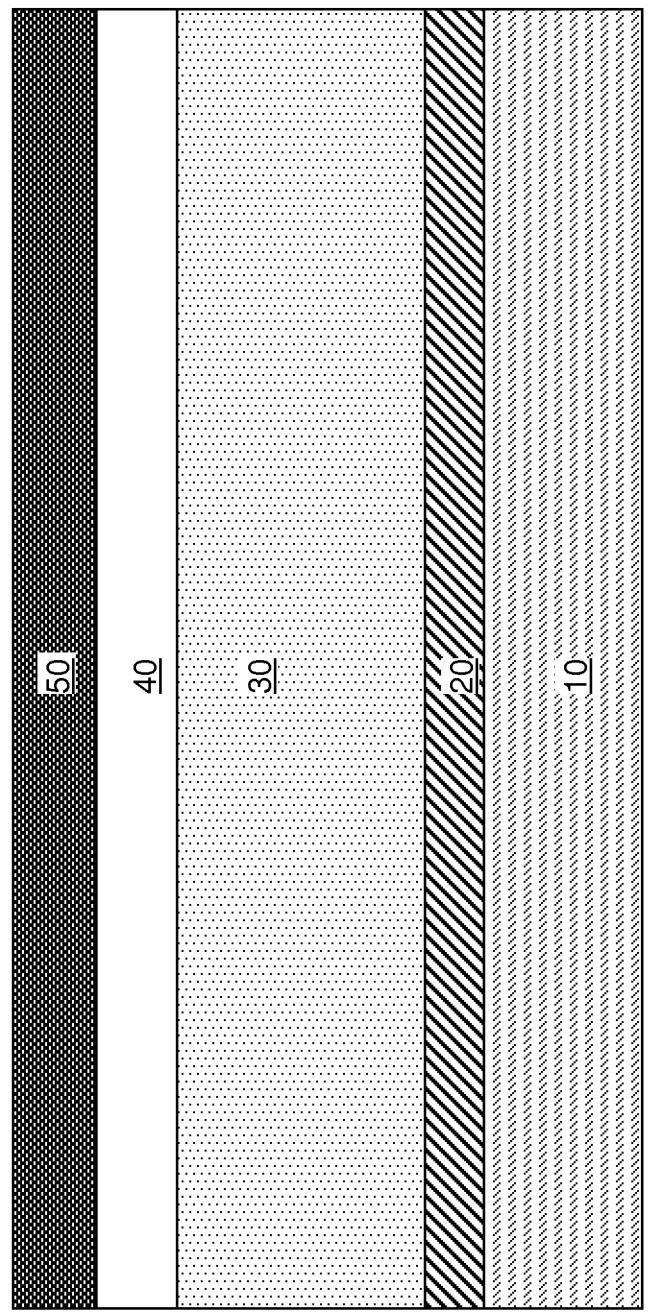
FIG. 1 is a vertical cross-sectional view of a first exemplary structure after formation of a vertical stack including an underlying material layer, a dielectric hard mask layer, and a metallic hard mask layer according to a first embodiment of the present disclosure.

Referring to FIG. 1, a first exemplary structure according to a first embodiment of the present disclosure includes a substrate 10 and a vertical stack (20, 30, 40, 50) including, from bottom to top, an underlying material layer 20, a material layer 30, and a dielectric hard mask layer 40, and a metallic hard mask layer 50. The substrate 10 can be a semiconductor substrate, a conductive substrate, an insulator substrate, or a combination thereof. In one embodiment, the substrate 10 can be a stack of a semiconductor substrate with semiconductor devices thereupon and at least one level of interconnect structures including interlayer dielectric materials and conductive metal interconnect structures embedded therein.

The underlying material layer 20 is optional, i.e., may, or may not, be present. The underlying material layer 20 can function as a capping layer for the topmost portion of the substrate 10. The underlying material layer 20 underlies, i.e., is located below, the material layer 30, and can include a dielectric material that is different from the dielectric material of the material layer 30. In one embodiment, the underlying material layer 20 can include nitrogen-containing non-porous organosilicate glass, which includes Si, C, O, H, and N. An exemplary nitrogen-containing non-porous organosilicate glass is NBLoK™ by Applied Materials, Inc. In another embodiment, the underlying material layer 20 can include silicon nitride or silicon oxynitride. The underlying material layer 20 can be deposited, for example, by chemical vapor deposition, and can have a thickness in a range from 2 nm to 10 nm, although lesser and greater thicknesses can also be employed.

The material layer 30 can include any material to be subsequently patterned. The material layer 30 can include a dielectric material, a conductive material, or a semiconductor material. In one embodiment, the material layer 30 can include a dielectric material such as doped silicate glass, undoped silicate glass, silicon nitride, non-porous organosilicate glass, porous organosilicate glass, or combinations or stacks thereof. In one embodiment, the material layer 30 can include porous organosilicate glass. The material layer 30 can be formed by chemical vapor deposition (CVD), spin-coating, or by other deposition methods known in the art. In one embodiment, the material layer 30 can be porous organosilicate glass deposited by chemical vapor deposition. The thickness of the material layer 30 can be in a range from 10 nm to 600 nm, although lesser and greater thicknesses can also be employed.

The dielectric hard mask layer 40 is optional. If present, the dielectric hard mask layer 40 includes a dielectric material such as silicon oxide, silicon oxynitride, silicon nitride, nitrogen-doped non-porous organosilicate glass, or a stack thereof. In one embodiment, the dielectric hard mask layer 40 can include a material commonly known as "TEOS oxide," which is silicon oxide (undoped silicate glass) deposited by chemical vapor deposition employing tetraethylorthosilicate (TEOS) as a precursor gas. The thickness of the dielectric hard mask layer 40 can be in a range from 2 nm to 20 nm, although lesser and greater thicknesses can also be employed.

The metallic hard mask layer 50 includes a metallic material, which can be, for example, a metallic nitride, a metallic carbide, an elemental metal, an intermetallic alloy, or a combination or a stack thereof. In one embodiment, the metallic hard mask layer 50 includes a metallic nitride such as TiN, TaN, WN, or an alloy thereof. The metallic hard mask layer 50 can be formed by chemical vapor deposition or physical vapor deposition. The thickness of the metallic hard mask layer 50 can be from 2 nm to 20 nm, although lesser and greater thicknesses can also be employed.

In one embodiment, the material layer 30 can include a porous or non-porous organosilicate glass, the dielectric hard mask layer 40 can include silicon oxide, silicon nitride, silicon oxynitride, or a nitrogen-containing organosilicate glass, and the metallic hard mask layer 50 can include a conductive metallic nitride.

Figure 2:
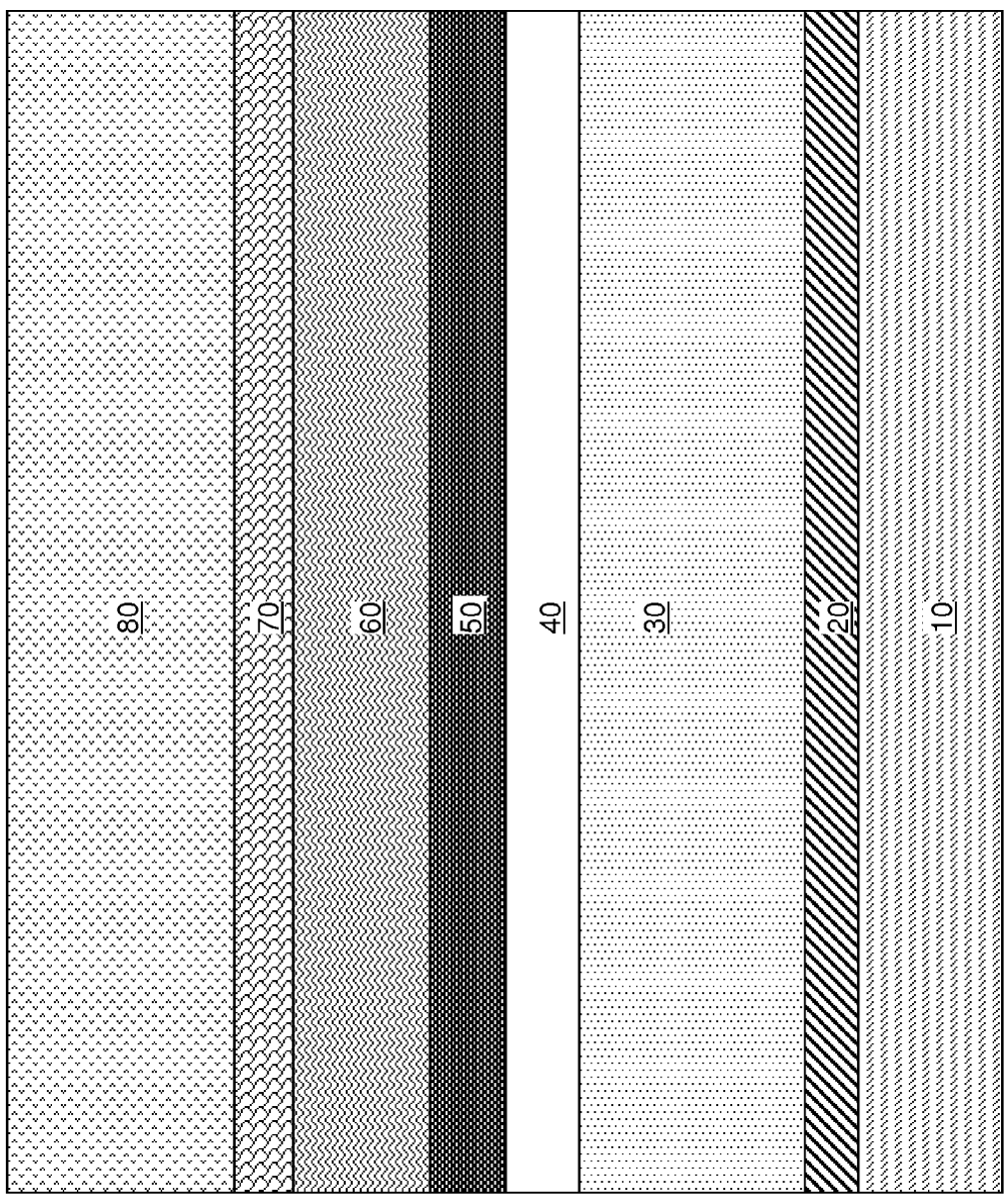
FIG. 2 is a vertical cross-sectional view of the first exemplary structure after formation of an organic planarization layer (OPL), an antireflective coating (ARC) layer, and a photoresist layer according to the first embodiment of the present disclosure.

Referring to FIG. 2, a lithographic material stack is applied over the metallic hard mask layer 50. The lithographic material stack includes at least a photoresist layer 80, and can optionally include an organic planarization layer (OPL) 60 and/or an antireflective coating (ARC) layer 70. In one embodiment, the lithographic material stack can include, from bottom to top, an OPL 60, an ARC layer 70, and a photoresist layer 80.

The OPL 60 can include an organic planarization material as known in the art. In one embodiment, the OPL 60 can include a non-photosensitive organic polymer material as known in the art. As used herein, a "non-photosensitive" material refers to a material that does not change chemical property upon irradiation for lithographic exposure employing a conventional light wavelength and a conventional dose level for exposure as known in the art. Exemplary organic planarizing materials that can be employed for the OPL 60 include ODL-102™, commercially available from ShinEtsu Chemical Co. Ltd.; HM8006™ and HM8014™, commercially available from JSR Corporation; and CHM701B™, commercially available from Cheil Chemical Co. Ltd. The organic planarization material can be deposited, for example, by spin coating. The thickness of the OPL 60 can be in a range from 20 nm to 600 nm, although lesser and greater thicknesses can also be employed.

The ARC layer 70 includes an antireflective coating material as known in the art. The ARC layer 70 can be used in a lithography process to improve the photoresist profile and to reduce the line width variation caused by scattering and reflecting light. The ARC layer 70 can include an inorganic silicon-based antireflective coating material, or can include an organic antireflective coating material. The ARC layer 70 can be applied, for example, by spin coating. The thickness of the ARC layer 70 can be in a range from 10 nm to 300 nm, although lesser and greater thicknesses can also be employed.

The photoresist layer 80 includes a photoresist material known in the art. The photoresist material can be a positive tone photoresist material or a negative tone photoresist material. The photoresist layer 80 can be sensitive to deep ultraviolet (DUV) radiation, mid-ultraviolet (MUV) radiation, or to irradiation by an electron beam (e-beam). The photoresist layer 80 can be applied by spin coating. The thickness of the photoresist layer 80 can be in a range from 200 nm to 1,200 nm, although lesser and greater thicknesses can also be employed.

Figure 3:
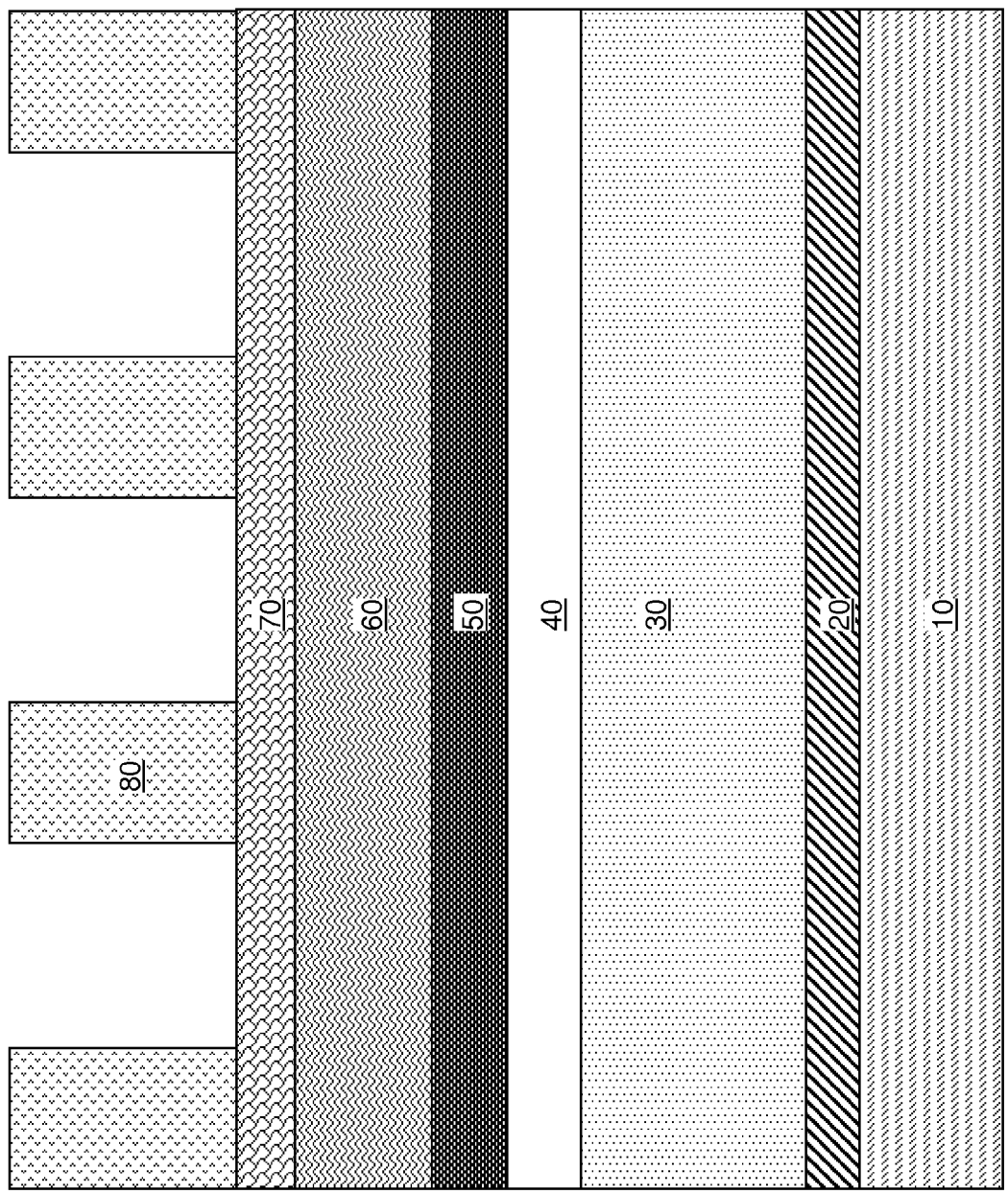
FIG. 3 is a vertical cross-sectional view of the first exemplary structure after lithographic patterning of the photoresist layer according to the first embodiment of the present disclosure.

Referring to FIG. 3, the photoresist layer 80 is lithographically patterned by lithographic exposure and development. A pattern including at least one opening is formed by the remaining portions of the photoresist layer 80 after development. Methods known in the art can be employed for the lithographic exposure and development of the photoresist layer 80.

Figure 4:
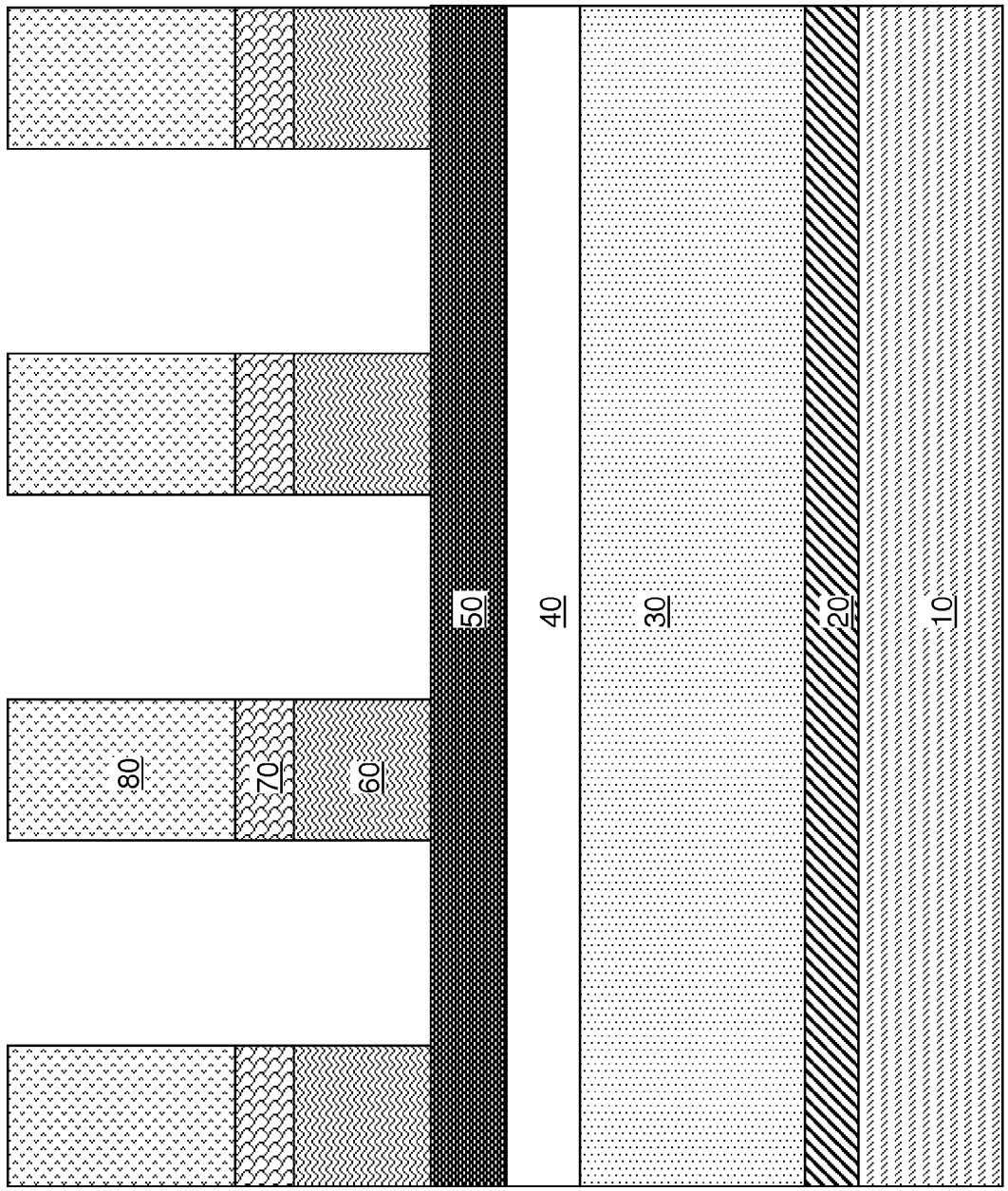
FIG. 4 is a vertical cross-sectional view of the first exemplary structure after transfer of the pattern in the photoresist layer through the ARC layer and the OPL according to the first embodiment of the present disclosure.

Referring to FIG. 4, a first anisotropic etch is performed employing the photoresist layer 80 as an etch mask to etch portions of the ARC layer 70 and the OPL 60 that are not covered by the photoresist layer 80. The first anisotropic etch can be a reactive ion etch that employs at least one hydrofluorocarbon gas and/or at least one hydrochlorocarbon gas as an etchant. Alternative etchant gases for etching the ARC layer 70 and the OPL 60 may also be employed in the first anisotropic etch. The pattern in the photoresist layer 80 is transferred through the ARC layer 70 and the OPL 60 by the first anisotropic etch.

Figure 5:
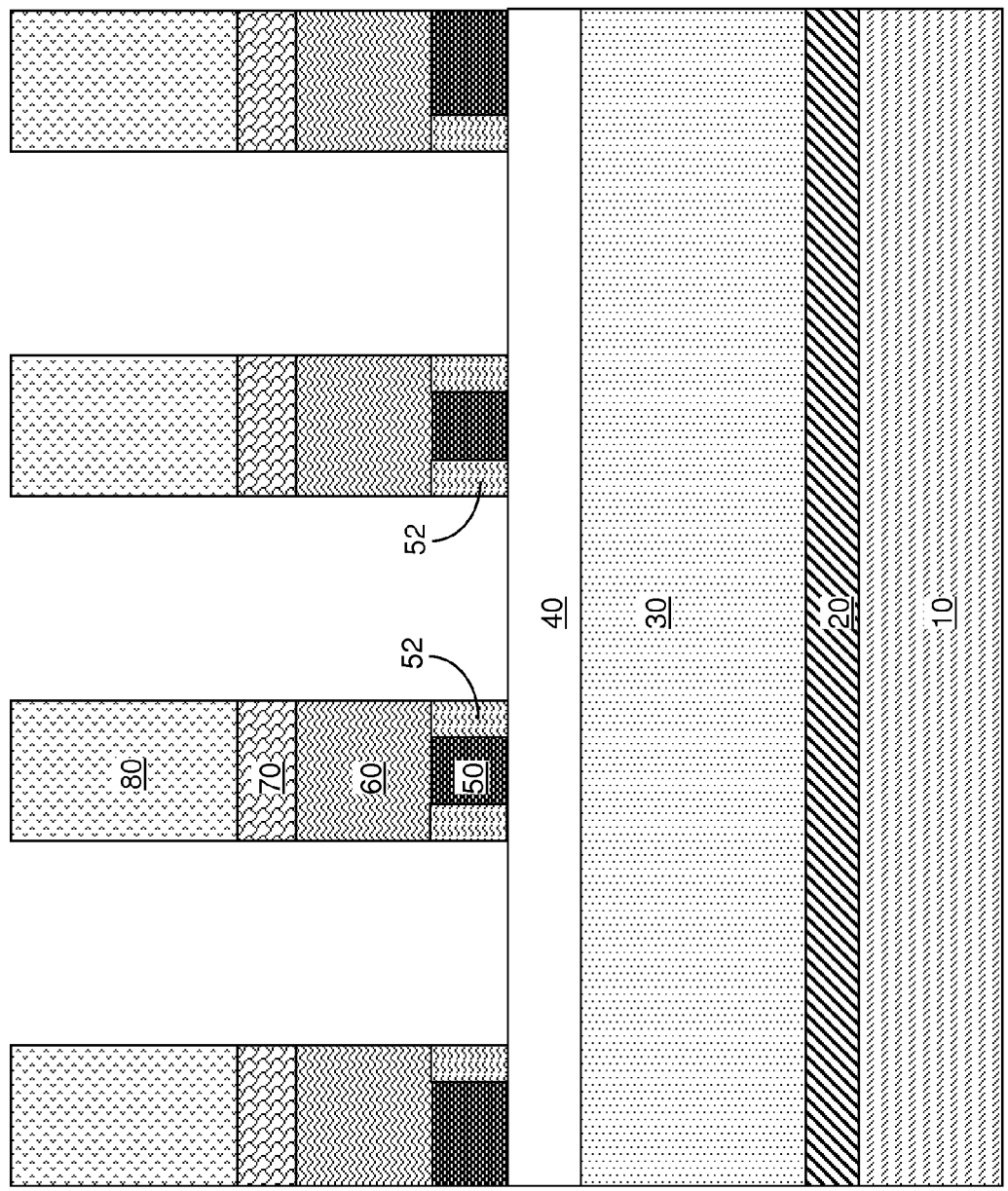
FIG. 5 is a vertical cross-sectional view of the first exemplary structure after anisotropically etching the metallic hard mask layer according to the first embodiment of the present disclosure.

Referring to FIG. 5, a second anisotropic etch is performed to etch unmasked portions of the metallic hard mask layer 50. The pattern in the photoresist layer 80 is transferred through the metallic hard mask layer 50 by the second anisotropic etch. The second anisotropic etch can be a reactive ion etch employing at least one hydrofluorocarbon gas and/or at least one hydrochlorocarbon gas as an etchant. For example, the second anisotropic etch can be performed employing $CH_2F_2$, $CHF_3$, $CCl_2F_2$, and/or $CHCl_2$ as an etchant.

In one embodiment, the sidewalls of the openings in the metallic hard mask layer 50 can be vertical. Further, the sidewalls of the openings in the metallic hard mask layer 50 can be laterally recessed during the second anisotropic etch. A organo-metallic passivation spacer 52 can be formed around each opening in the metallic hard mask layer 50 while the pattern in the photoresist layer 80 is transferred through the metallic hard mask layer 50 by the second anisotropic etch. The organo-metallic passivation spacers 52 can be formed by reaction of the reactant and sputtered organic materials from the OPL 60 with the metallic material of the metallic hard mask layer 50 during the second anisotropic etch. Surfaces portions of the metallic hard mask layer 50 interact with the etchant to form a compound including the same metallic element as the metallic hard mask layer 50 and at least one halogen atom. If the metallic hard mask layer 50 includes a metallic nitride, the compound in the organo-metallic passivation spacers 52 can further include a nitrogen atom. In one embodiment, the metallic hard mask layer 50 can include titanium nitride, and the organo-metallic passivation spacers 52 can include a compound of titanium, organic material originally contained in (and incorporated from) the OPL 60, nitrogen, and a halogen atom. Optionally, surface portions of the underlying dielectric hard mask layer 40 may be backscattered and incorporated into the organo-metallic passivation spacers 52.

The sidewall surfaces of the metallic hard mask layer 50 are laterally recessed during formation of the organo-metallic passivation spacers 50. Thus, the interface between a organo-metallic passivation spacer 52 and the metallic hard mask layer 50 can laterally move away from the opening in the vertical stack of the metallic hard mask layer 50, the OPL 60, the ARC layer 70, and the photoresist layer 80. The thickness of the organo-metallic passivation spacers 52 at the end of the second anisotropic etch can be in a range from 0.5 nm to 5 nm, although lesser and greater thicknesses can also be employed.

The sidewalls of the patterned portions of the metallic hard mask layer 50 can be laterally offset with respect to the sidewalls of the OPL 60 and the sidewalls of the ARC layer 70. In one embodiment, inner sidewalls of each organo-metallic passivation spacer 52 can be vertically coincident with sidewalls of the OPL 60. As used herein, an "inner sidewall" of a organo-metallic passivation spacer 52 refers to the sidewall of the organo-metallic passivation spacer 52 that is in contact with the opening within the organo-metallic passivation spacer 52. As used herein, two surfaces are vertically coincident if the two surfaces are within a same vertical plane.

Figure 6:
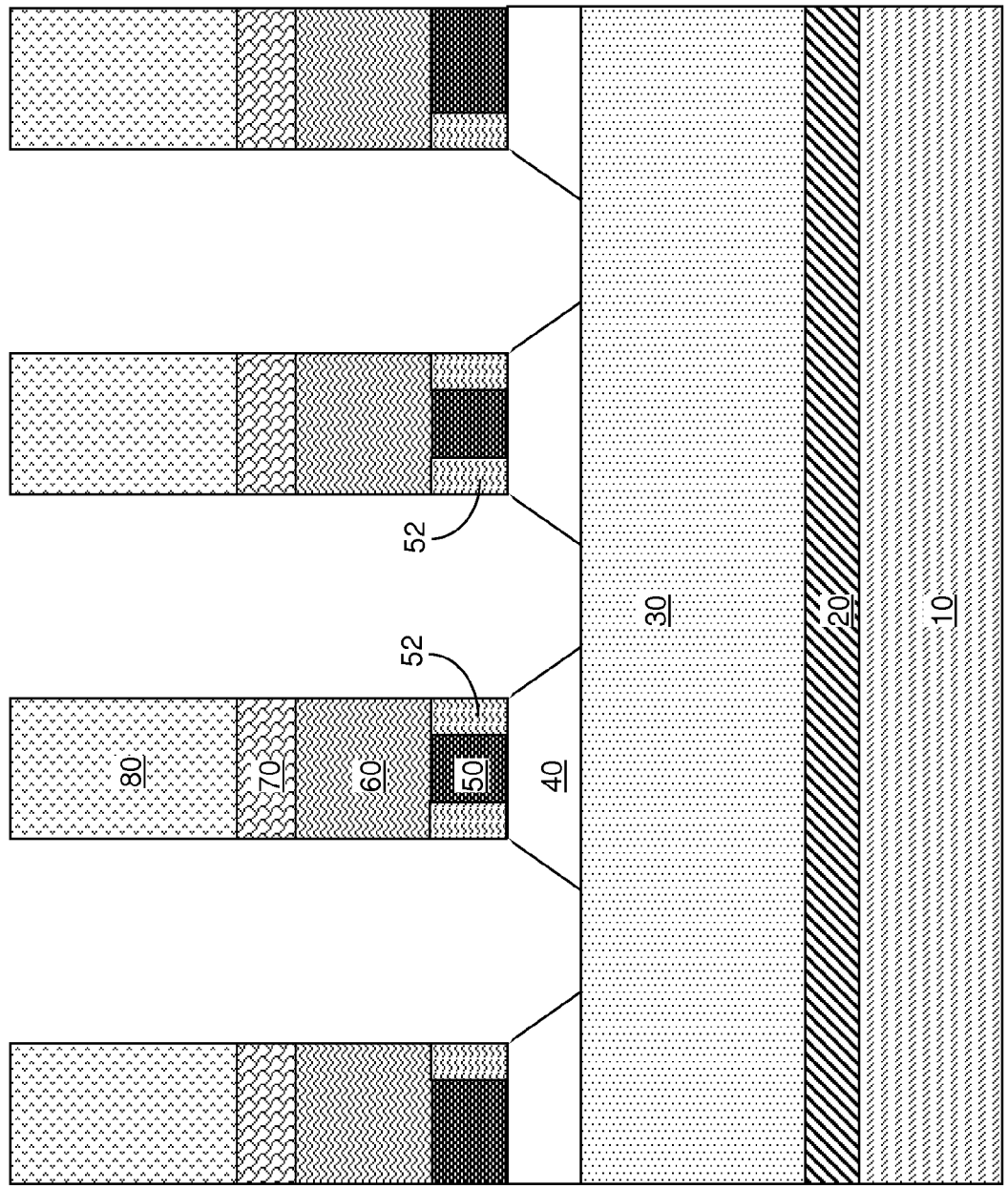
FIG. 6 is a vertical cross-sectional view of the first exemplary structure after forming organo-metallic passivation spacers and anisotropically etching the dielectric hard mask layer according to the first embodiment of the present disclosure.

Referring to FIG. 6, after the top surface of the dielectric hard mask layer 40 is physically exposed underneath each opening in the metallic hard mask layer 50, the dielectric hard mask layer 40 is anisotropically etched employing a third anisotropic etch. Tapered sidewalls of the dielectric mask layer 40 can be formed underneath each opening in the metallic hard mask layer 50 during the third anisotropic etch. The pattern in the photoresist layer 80 can be transferred through the dielectric hard mask layer 40 in the third anisotropic etch while forming the organo-metallic passivation spacers 52 on the sidewalls of the openings in the metallic hard mask layer 50.

Figure 7:
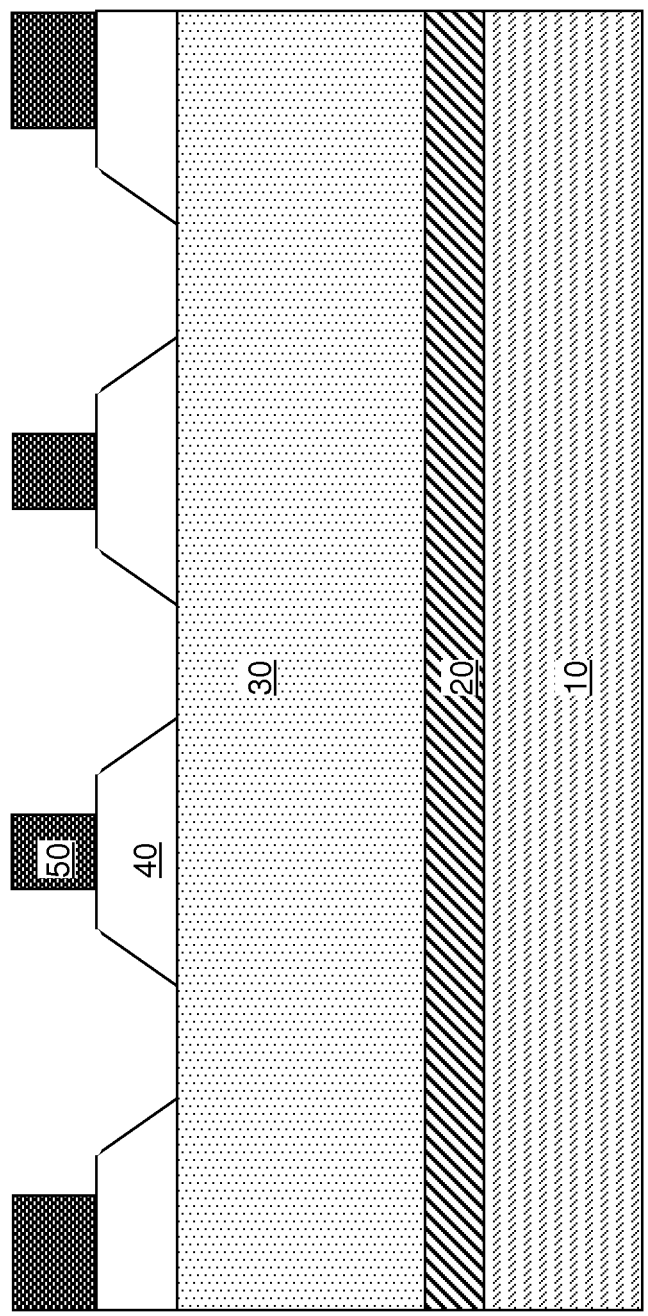
FIG. 7 is a vertical cross-sectional view of the first exemplary structure after a combination of wet cleaning and ashing according to the first embodiment of the present disclosure.

Referring to FIG. 7, a wet clean process may be optionally performed to remove etch residue materials from the top surface of the dielectric hard mask layer 40 and the organo-metallic passivation spacers 52. The wet clean process can be, for example, an SC-1 clean employing ammonia and hydrogen peroxide.

Subsequently, an ashing process is performed to simultaneously remove the photoresist layer 80, the residual portions of the ARC layer 70, the residual portions of the OPL 60, and the organo-metallic passivation spacers 52 selective to the metallic hard mask layer 50, the dielectric hard mask layer 40, and the material layer 30. The ashing process can employ a combination of $Cl_2$ and $N_2$.

In one embodiment, the ashing process can be performed at a pressure selected from the range from 1 mTorr to 300 mTorr, and at a temperature selected from the range from −20° C. to 400° C. In an illustrative example, in a process chamber configured to process a 300 mm diameter substrate, the flow rate of the $Cl_2$ can be in a range from 1 sccm (standard cubic centimeters per minute) to 300 sccm, and the flow rate of $N_2$ can be in a range from 1 sccm to 300 sccm. In a non-limiting illustrative example, the flow rate of the $Cl_2$ can be in a range from 10 sccm to 90 sccm, and the flow rate of $N_2$ can be in a range from 100 sccm to 300 sccm. During the ashing process, the photoresist layer 80, the residual portions of the ARC layer 70, the residual portions of the OPL 60, and the organo-metallic passivation spacers 52 are removed. In one embodiment, processing gases employed for the ashing process does not include oxygen atoms, oxygen ions, oxygen molecules, ozone ions, or ozone molecules.

The remaining first exemplary structure includes the metallic hard mask layer 50, the dielectric hard mask layer 40, the material layer 30, the underlying material layer 20, and the substrate 10. Because the sidewalls of the metallic hard mask layer 50 are vertical prior to the ashing process and the ashing process is effective in removing the organo-metallic passivation spacers 52, the remaining portions of the metallic hard mask layer 50 after the ashing process have vertical sidewalls.

Underneath each opening in the metallic hard mask layer 50, the dielectric hard mask layer 40 can include a planar peripheral surface that is physically exposed to the ambient and adjoining the vertical sidewalls of the metallic hard mask layer 50 after the ashing process. The ambient herein refers to the environment in which the first exemplary structure is placed after the ashing process, which can be, for example, air, vacuum, or an inert environment. Further, the dielectric hard mask layer 40 can include a tapered sidewall surface adjoining an inner periphery of the planar peripheral surface of the dielectric hard mask layer 40. In one embodiment, the planar peripheral surface can have the same distance between an inner periphery that adjoins the tapered sidewall surface and an outer periphery that adjoins the vertical sidewalls of the metallic hard mask layer 50 throughout an entirety of the planar peripheral surface.

Figure 8:
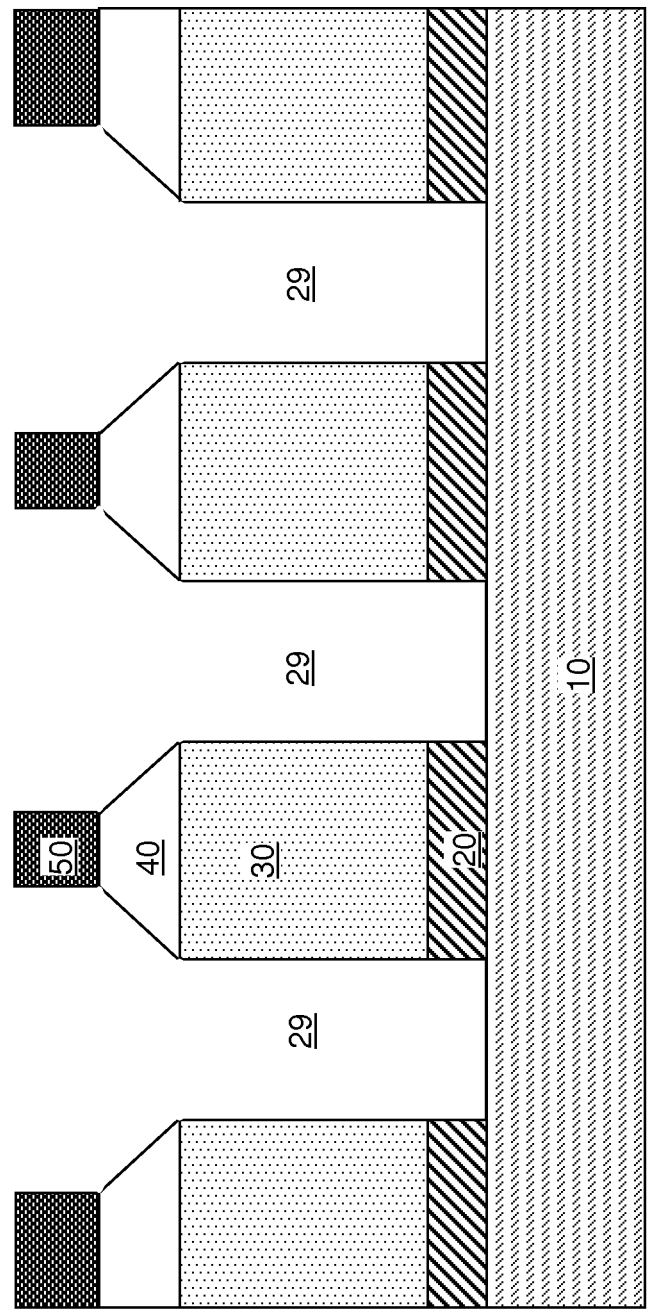
FIG. 8 is a vertical cross-sectional view of the first exemplary structure after anisotropically etching the underlying material layer according to the first embodiment of the present disclosure.

Referring to FIG. 8, the material layer 30 and the underlying material layer 20 can be anisotropically etched employing the dielectric hard mask layer 40 as an etch mask. The lateral dimensions of cavities 29 in the material layer 30 and the underlying material layer 20 can be greater than corresponding lateral dimensions that can be obtained employing methods known in the art because the tapered sidewall surfaces of the dielectric hard mask layer 40 can laterally move outward during the anisotropic etch as the physically exposed portions of the dielectric hard mask layer 40 erode during the anisotropic etch. Thus, cavities 29 having greater lateral dimensions can be formed employing the method of the present disclosure than prior art methods.

The method of the present disclosure provides a novel ashing chemistry employing a combination of $Cl_2$ and $N_2$, which replaces the traditional ashing chemistry employing a combination of $O_2$ and $N_2$. The ashing chemistry employing the combination of $Cl_2$ and $N_2$ can reduce the taper profile of the metallic hard mask layer 50 that would otherwise be present at the processing step of FIG. 7. A reactive ion etch (RIE) shoulder, i.e., a horizontal peripheral surface around each opening in the dielectric hard mask layer 40, is formed at the interface between the metallic hard mask layer 50 and the dielectric hard mask layer 40. The presence of the RIE shoulder can be advantageously employed to form wider cavities 29 as illustrated in FIG. 8.

Further, given that reduction of aspect ratio dependency in the etch rate (which is commonly referred to as a "RIE lag") is strongly desirable for manufacture of small scale semiconductor devices, the methods of the present disclosure can reduce the effect of the RIE lag through formation of vertical sidewalls of the metallic hard mask layer 50 at the processing step of FIG. 7 and formation of wider cavities 29 at the processing step of FIG. 8. In addition, the etch selectivity between the metallic hard mask layer 50 and the material layer 30 can be improved through use of the new ashing chemistry employing a combination of $Cl_2$ and $N_2$.

Figure 9:
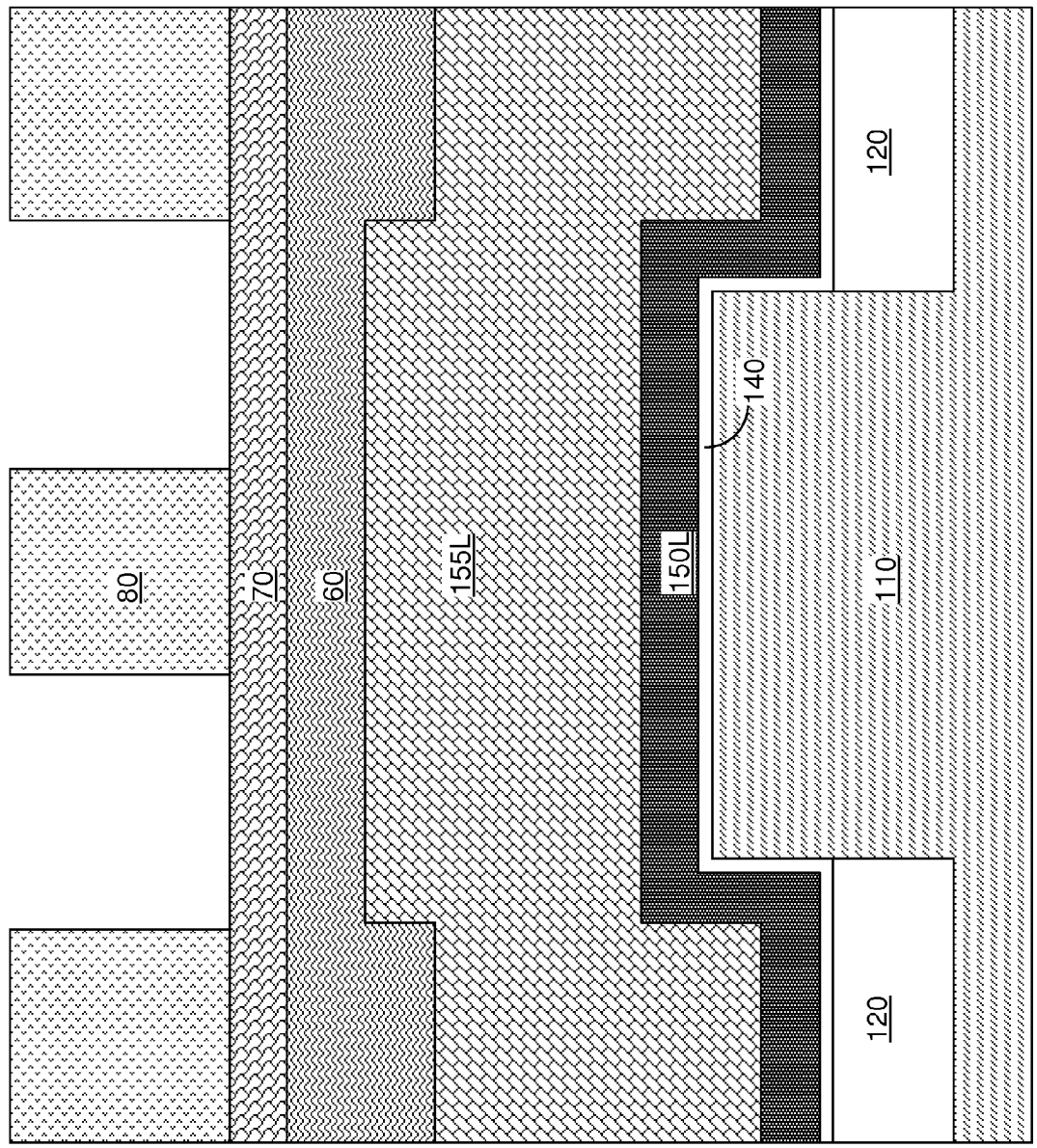
FIG. 9 is a vertical cross-sectional view of a second exemplary semiconductor structure after formation of a gate stack, an OPL, an ARC layer, and a patterned photoresist layer according to a second embodiment of the present disclosure.

Referring to FIG. 9, a second exemplary semiconductor structure according to a second embodiment of the present disclosure includes a substrate 110, and shallow trench isolation structures 120 embedded in the substrate 110. A vertical stack including, from bottom to top, a gate dielectric layer 140, a metallic material layer 150L, a semiconductor material layer 155L, an organic planarization layer 60, an antireflective coating layer 70, and a patterned photoresist layer 80 is formed on a planar top surface and a recessed horizontal surface that are provided on, or over, the substrate 110.

In one embodiment, the semiconductor substrate 110 can include a semiconductor material, which can be any semiconductor material known in the art. For example, the substrate 110 can include single crystalline silicon.

The shallow trench isolation structures 120 can be formed by forming shallow trenches in the semiconductor substrate 110, by filling the shallow trenches with a dielectric material such as silicon oxide, silicon oxynitride, and/or silicon nitride, and by planarizing the top surface of the dielectric material. The planarization of the top surface of the dielectric material can be performed, for example, by a recess etch, chemical mechanical planarization (CMP), or a combination thereof.

In one embodiment, the top surfaces of the shallow trench isolation structures 120 can be vertically offset from the topmost surface of the semiconductor substrate 110. In one embodiment, one of the planar top surface and the recessed horizontal surface can be a semiconductor surface, and the other of the planar top surface and the recessed horizontal surface can be a dielectric surface. In one embodiment, the dielectric surface can be a planar top surface of a shallow trench isolation structure 120 embedded within the substrate 110 that includes a semiconductor material portion, and the semiconductor surface can be a top surface of the semiconductor material portion.

The gate dielectric layer 140 can include any gate dielectric material known in the art. For example, the gate dielectric layer 140 can include silicon oxide, silicon oxynitride, a dielectric metal oxide having a dielectric constant greater than 8.0, or a combination thereof. The gate dielectric layer 140 can be formed, for example, by chemical vapor deposition or atomic layer deposition.

The metallic material layer 150L includes a metallic material, which can be, for example, a conductive metallic nitride material such as TiN, TaN, and/or WN. The metallic material layer 150L can be formed, for example, by chemical vapor deposition of physical vapor deposition. The metallic material layer 150L of the second embodiment can have the same composition as the metallic hard mask layer 50 of the first embodiment, and can be formed employing the same method as the metallic hard mask layer 50 of the first embodiment.

The semiconductor material layer 155L is optional, and if present, includes a doped semiconductor material such as doped polysilicon or a doped silicon germanium alloy. The semiconductor material layer 155L can be formed, for example, by chemical vapor deposition.

Each of the OPL 60, the ARC layer 70, and the patterned photoresist layer 80 can be the same as in the first embodiment, and can be formed employing the same methods as in the first embodiment.

Figure 10:
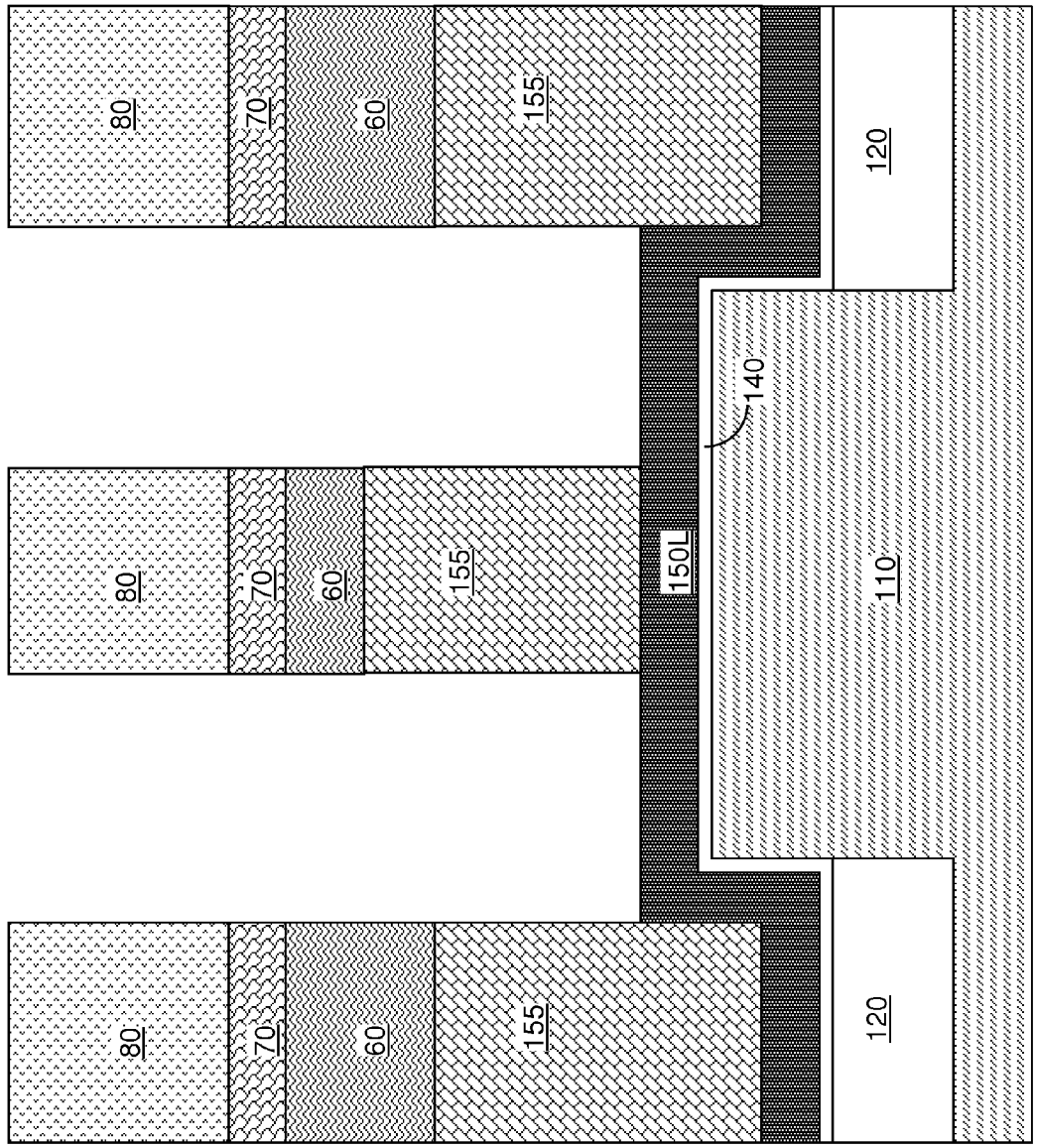
FIG. 10 is a vertical cross-sectional view of the second exemplary semiconductor structure after transfer of the pattern in the photoresist layer through the ARC layer, the OPL, and a semiconductor material layer according to the second embodiment of the present disclosure.

Referring to FIG. 10, at least one anisotropic etch process is performed to transfer the pattern in the photoresist layer 80 through the ARC layer 70, the OPL 60, and the semiconductor material layer 155L. The ARC layer 70, the OPL 60, and the semiconductor material layer 155L are etched employing the patterned photoresist layer 80 as an etch mask. The remaining portions of the semiconductor material layer 155L can constitute semiconductor gate electrode portions 155.

Figure 11:
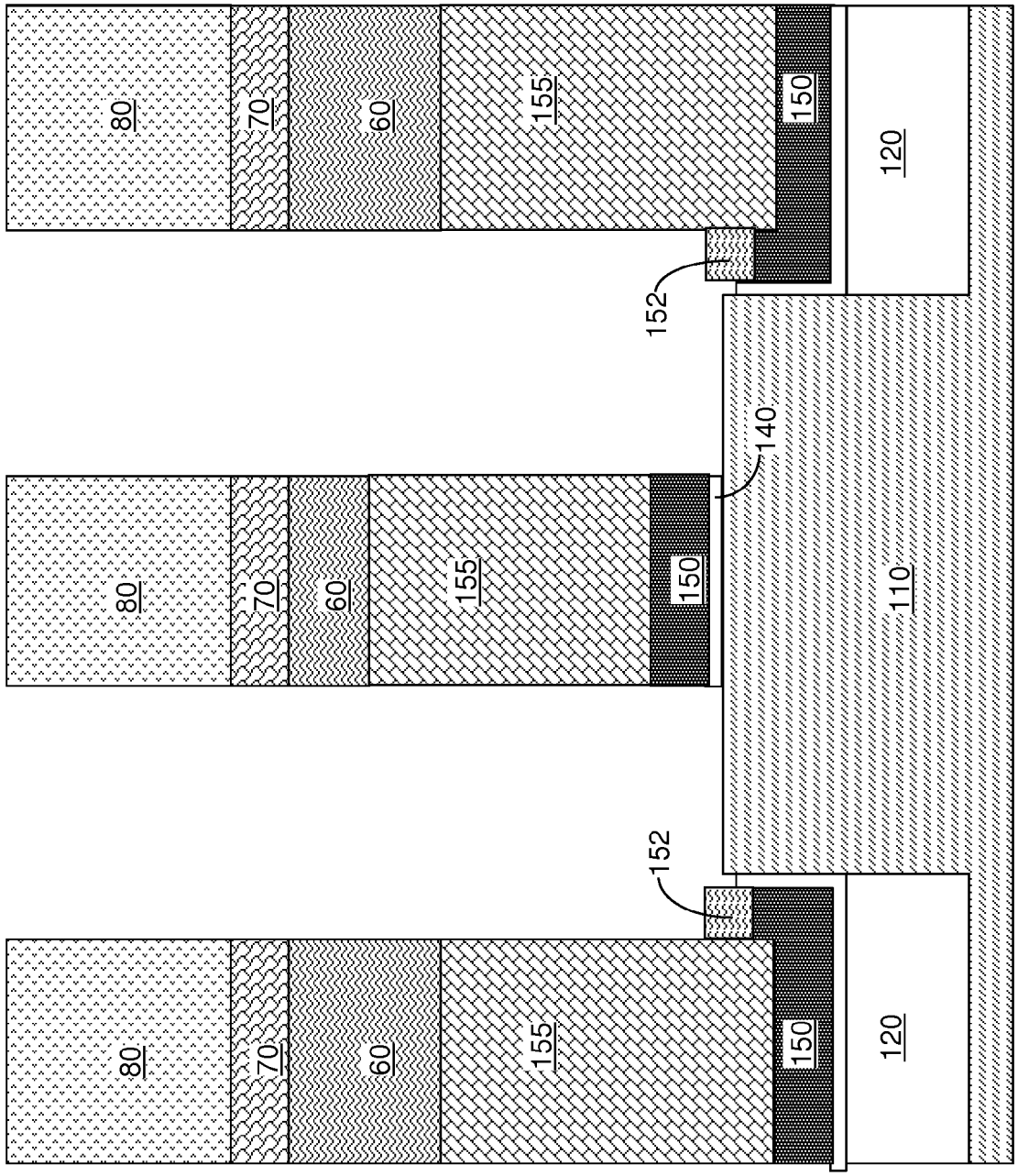
FIG. 11 is a vertical cross-sectional view of the second exemplary semiconductor structure after patterning a metallic material layer according to the second embodiment of the present disclosure.

Referring to FIG. 11, the metallic material layer 150L is etched by an anisotropic etch that employs the photoresist layer 80 as an etch mask. Portions of the metallic hard mask layer 50 not covered by the photoresist layer 80 are etched by the anisotropic etch. The anisotropic etch can be a reactive ion etch employing at least one hydrofluorocarbon gas and/or at least one hydrochlorocarbon gas as an etchant. The same process can be employed for the anisotropic etch for etching the metallic material layer 150L of the second embodiment as the second anisotropic etch of the first embodiment.

In one embodiment, a organo-metallic passivation spacer 152 can be formed on the top of the vertical remaining portions of the metallic material layer 150 during the anisotropic etch. The organo-metallic passivation spacers 152 can be formed by reaction of the reactant with the metallic material of the metallic material layer 150 during the anisotropic etch. Surfaces portions of the metallic material layer 150 interact with the etchant to form a compound including the same metallic element as the metallic material layer 150 and at least one halogen atom. The organo-metallic passivation spacers 152 of the second embodiment can have the same composition as the organo-metallic passivation spacers 51 of the first embodiment.

Subsequently, physically exposed portions of the gate dielectric layer 140 can be etched, for example, by a wet etch. Etch chemistries known in the art can be employed to etch the physically exposed portions of the gate dielectric layer 140.

Figure 12:
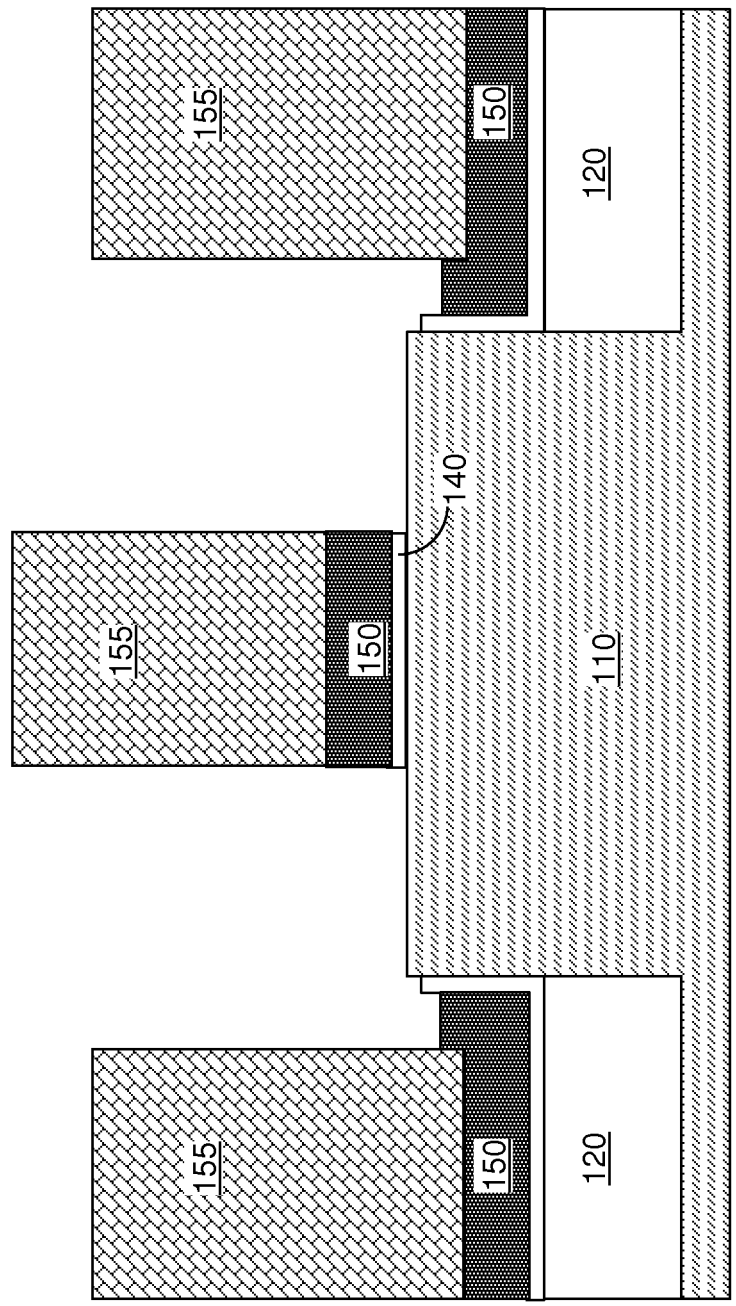
FIG. 12 is a vertical cross-sectional view of the second exemplary semiconductor structure after an ashing process according to the second embodiment of the present disclosure.

Referring to FIG. 12, a wet clean process may be optionally performed to remove etch residue materials from the top surface of the substrate 110 and the organo-metallic passivation spacers 152. The wet clean process can be, for example, an SC-1 clean employing ammonia and hydrogen peroxide.

Subsequently, an ashing process is performed to simultaneously remove the photoresist layer 80, the residual portions of the ARC layer 70, the residual portions of the OPL 60, and the organo-metallic passivation spacers 152 selective to the metallic gate electrode portions 150, the gate dielectric layer 140, and the substrate 110. The ashing process can employ a combination of $Cl_2$ and $N_2$. The same ashing process can be employed as in the first embodiment.

Figure 13:
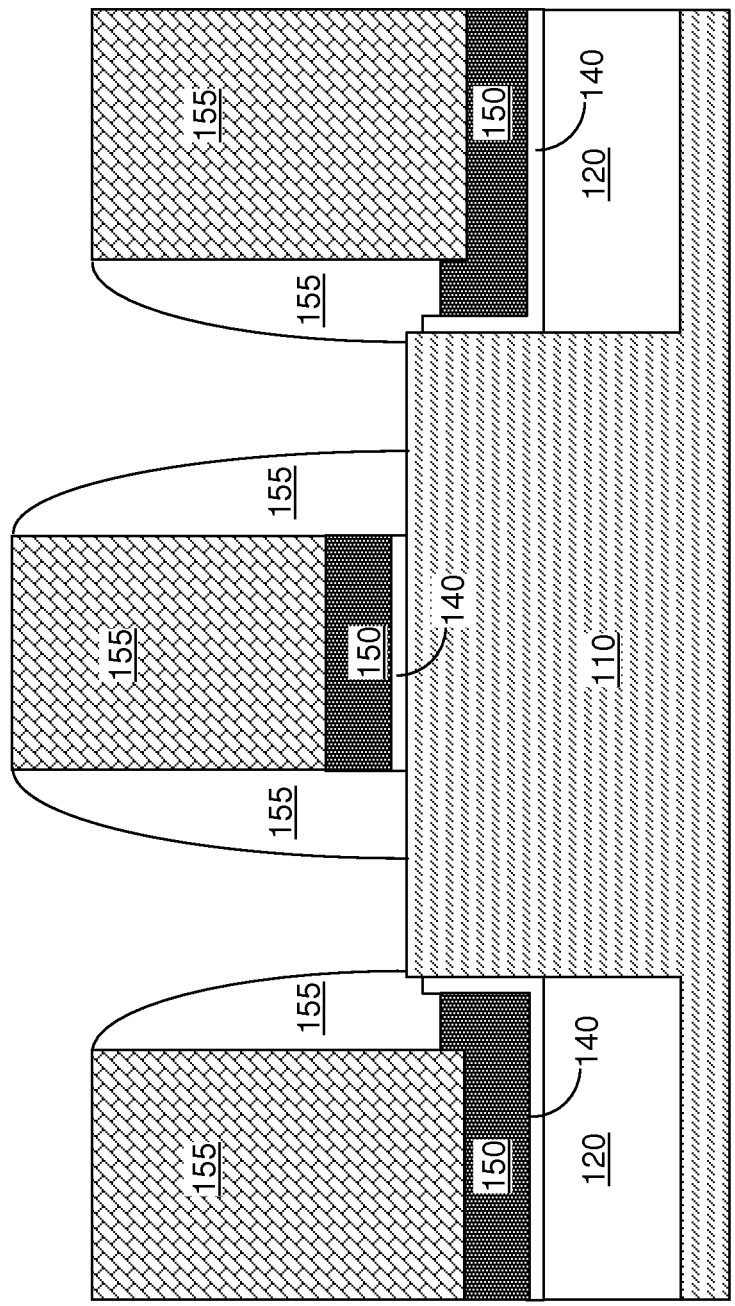
FIG. 13 is a vertical cross-sectional view of the second exemplary semiconductor structure after formation of gate spacers according to the second embodiment of the present disclosure.

Referring to FIG. 13, additional processing steps for forming semiconductor devices can be subsequently performed. For example, gate spacers 155 including a dielectric material can be formed around each gate electrode (150, 155) by deposition of a conformal dielectric material layer and a subsequent anisotropic etch.

As applied to the second embodiment, the methods of the present disclosure enable removal of a metallic material stringer during the patterning of a gate electrode by enabling recessing of vertical portions of the metallic material layer 150 while minimizing the collateral etching of the gate dielectric layer 140 and/or the substrate 110.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of patterning a structure, said method comprising:
    forming a vertical stack, from bottom to top, comprising at least a gate dielectric layer, a metallic material layer, an organic planarization layer (OPL), and a photoresist layer on a planar top surface and a recessed horizontal surface that are provided on, or over, a substrate;
    lithographically patterning said photoresist layer;
    etching said OPL and said metallic material layer employing at least one anisotropic etch that employs said patterned photoresist layer as an etch mask;
    etching physically exposed portions of said gate dielectric layer; and
    simultaneously removing a residual portion of said OPL and a vertical portion of said metallic material layer over said recessed horizontal surface employing an ashing process, said ashing process employing a combination of $Cl_2$ and $N_2$ to remove said OPL and said vertical portion of said metallic material layer.

2. The method of claim 1, wherein said vertical stack further comprises a semiconductor material layer overlying said metallic material layer and underlying said OPL, wherein said at least one anisotropic etch transfers said pattern through said semiconductor material layer.

3. The method of claim 1, wherein said metallic material layer comprises a conductive metallic nitride material.

4. The method of claim 1, wherein said patterned photoresist is removed simultaneously with said OPL during said ashing process.

5. The method of claim 1, wherein said vertical portion of said metallic material layer contact a vertical portion of said gate dielectric layer.

6. The method of claim 1, wherein processing gases employed for said ashing process does not include oxygen atoms, oxygen ions, oxygen molecules, ozone ions, or ozone molecules.

7. The method of claim 1, wherein said ashing process is performed at a pressure range from 1 mTorr to 300 mTorr and at a temperature from −20° C. to 400° C.

8. The method of claim 1, wherein said $Cl_2$ is introduced into a process chamber at a flow rate from 1 sccm to 300 sccm and said $N_2$ is introduced into said process chamber at a flow rate from 100 sccm to 300 sccm.

9. The method of claim 1, wherein said etching physically exposed portions of said gate dielectric layer comprises a wet etch.

10. The method of claim 1, wherein said gate dielectric layer comprises silicon oxide, silicon oxynitride or a dielectric metal oxide having a dielectric constant of greater than 8.0.

11. The method of claim 1, wherein one of said planar top surface and said recessed horizontal surface is a semiconductor surface, and another of said planar top surface and said recessed horizontal surface is a dielectric surface.

12. The method of claim 11, wherein said dielectric surface is a planar top surface of a shallow trench isolation structure embedded within a substrate that includes a semiconductor material portion, wherein said semiconductor surface is a top surface of said semiconductor material portion.

13. The method of claim 1, wherein said at least one anisotropic etch comprises a reactive ion etch including at least one etchant selected from a hydrofluorocarbon gas and a hydrochlorocarbon gas.

14. The method of claim 13, wherein said at least one etchant comprises $CH_2F_2$, $CHF_3$, $CCl_2F_2$, $CHCl_2$ or any mixture thereof.

15. The method of claim 1, wherein during said at least one anisotropic etching of said metallic hard mask layer an organo-metallic passivation spacer is formed on sidewalls of an opening in said metallic hard mask layer.

16. The method of claim 15, wherein said organo-metallic passivation spacer comprises a compound comprising a same metallic material as said metallic hard mask layer and a halogen.

17. The method of claim 16, wherein prior to said ashing said organo-metallic passivation spacer is removed by a wet etch process.

* * * * *